US012560656B2

(12) United States Patent
Jeong et al.

(10) Patent No.: US 12,560,656 B2
(45) Date of Patent: Feb. 24, 2026

(54) SYSTEM AND METHOD OF MONITORING BATTERY

(71) Applicant: SK ON CO., LTD., Seoul (KR)

(72) Inventors: Da Eun Jeong, Daejeon (KR); Tae Kyun Kim, Daejeon (KR); Tae Hyung Heo, Daejeon (KR); Sang Hoon Kim, Daejeon (KR); Byung Eun Lee, Daejeon (KR); Moon Goo Jeong, Daejeon (KR)

(73) Assignee: SK ON CO., LTD., Seoul (KR)

( * ) Notice: Subject to any disclaimer, the term of this patent is extended or adjusted under 35 U.S.C. 154(b) by 733 days.

(21) Appl. No.: 17/860,938

(22) Filed: Jul. 8, 2022

(65) Prior Publication Data

US 2023/0011148 A1 Jan. 12, 2023

(30) Foreign Application Priority Data

Jul. 9, 2021 (KR) ........................ 10-2021-0090208

(51) Int. Cl.
*G01R 31/392* (2019.01)
*G01R 31/371* (2019.01)
*G01R 31/396* (2019.01)

(52) U.S. Cl.
CPC ......... *G01R 31/392* (2019.01); *G01R 31/371* (2019.01); *G01R 31/396* (2019.01)

(58) Field of Classification Search
CPC .. G01R 31/392; G01R 31/371; G01R 31/396; G01R 31/367; G01R 31/382; B60L 2240/54; B60L 2260/42; B60L 2260/50; B60L 3/0046; B60L 58/16; B60L 58/12; B60L 58/10; B60L 53/80;
(Continued)

(56) References Cited

U.S. PATENT DOCUMENTS 11,271,255 B2 * 3/2022 Vickery .................. B60L 58/27
11,368,030 B2 * 6/2022 Belkacem-Boussaid ....................
H02J 3/004
(Continued)

FOREIGN PATENT DOCUMENTS

EP 3981642 A1 4/2022
JP 2019154220 A * 9/2019 .............. B60L 53/80
(Continued)

OTHER PUBLICATIONS

Banguero et al. "A Review on Battery Charging and Discharging Control Strategies: Application to Renewable Energy Systems" (Year: 2018).*
(Continued)

*Primary Examiner* — Eyob Hagos
(74) *Attorney, Agent, or Firm* — Perkins Coie LLP

(57) ABSTRACT

A battery monitoring system includes a data receiver configured to receive battery information data and vehicle information data from a data collecting device connected to a vehicle, a battery management score calculator configured to calculate, based on the battery information data and the vehicle information data, factors affecting battery degradation among a charging habit, a driving habit, and a parking habit of a user, calculate, based on the factors, a battery management score, and store the battery management score in a database, and an information transmitter configured to transmit the battery management score to a terminal.

16 Claims, 7 Drawing Sheets

(58) Field of Classification Search

CPC ......... B60L 2240/545; B60L 2240/547; B60L 2240/549; B60L 2250/18; Y02T 10/70; Y02T 10/72; B60W 20/13; B60W 40/09; B60W 2540/30; G06Q 40/08; H01M 10/48; H01M 2010/4271; H01M 2220/20; B60Y 2200/91; B60Y 2200/92

See application file for complete search history.

(56) References Cited

U.S. PATENT DOCUMENTS

| | | | | |
|---|---|---|---|---|
| 2017/0129361 | A1* | 5/2017 | Scaringe | H02J 7/14 |
| 2017/0282739 | A1* | 10/2017 | Cha | G07C 5/0825 |
| 2018/0203070 | A1* | 7/2018 | Park | G01R 31/392 |
| 2019/0207267 | A1* | 7/2019 | Vickery | B60L 53/80 |
| 2019/0392320 | A1 | 12/2019 | Kim | |
| 2021/0184273 | A1* | 6/2021 | Lee | B60L 58/16 |
| 2022/0281345 | A1* | 9/2022 | Kim | B60L 58/16 |
| 2023/0182575 | A1* | 6/2023 | Kim | G01R 31/392 |
| | | | | 701/22 |

FOREIGN PATENT DOCUMENTS

| | | | | |
|---|---|---|---|---|
| KR | 10-2016-0031071 A | 3/2016 | | |
| KR | 10-2019-0050881 A | 5/2019 | | |
| KR | 10-2021-0016134 A | 2/2021 | | |
| KR | 10-2021-0016797 A | 2/2021 | | |
| KR | 2022156254 A | * | 11/2022 | G01R 27/02 |

OTHER PUBLICATIONS

European Search Report for EP Patent Application No. 22183959.0, dated Dec. 1, 2022, 8 pages.

* cited by examiner

| PROPERTIES | DETAILED ITEMS |
|---|---|
| CHARGING HABIT | -NUMBER OF TIMES OF RAPID CHARGING<br>-NUMBER OF TIMES OF SLOW CHARGING<br>-RATIO OF NUMBER OF TIMES OF RAPID CHARGING TO NUMBER OF TIMES OF SLOW CHARGING<br>-NUMBER OF TIMES OF CHARGING FROM SOC OF 20% OR LESS TO SOC OF 100%,<br>-UNATTENDED PERIOD OF TIME AFTER CHARGING UP TO SOC OF 100%<br>-NUMBER OF TIMES BATTERY IS CHARGED IN SITUATION IN WHICH BATTERY IS AT HIGH TEMPERATURE<br>-NUMBER OF TIMES BATTERY IS CHARGED IN SITUATION IN WHICH TEMPERATURE DIFFERENCE BETWEEN EXTERNAL TEMPERATURE AND BATTERY TEMPERATURE IS PREDETERMINED TEMPERATURE (FOR EXAMPLE, 20°C.) OR MORE |
| DRIVING HABIT | -NUMBER OF TIMES OF RAPID ACCELERATIONS WHILE VEHICLE IS BEING DRIVEN<br>-NUMBER OF TIMES OF RAPID DECELERATIONS WHILE VEHICLE IS BEING DRIVEN<br>-PERIOD OF TIME REQUIRED FOR DRIVING IN HIGH-TEMPERATURE ENVIRONMENT (FOR EXAMPLE, 45°C. OR HIGHER) |
| PARKING HABIT | -PERIOD OF TIME WHEN VEHICLE IS LEFT UNATTENDED IN DIRECT-SUNLIGHT AND HIGH-TEMPERATURE ENVIRONMENT (FOR EXAMPLE, 45°C. OR HIGHER).<br>-NUMBER OF TIMES VEHICLE IS COMPLETELY DISCHARGED (SOC OF 0%) |

FIG. 4

COLLECT BATTERY-RELATED DATA ON BATTERY DEGRADATION FACTORS ⎯ S310

CALCULATE INDICATOR INDICATING BATTERY MANAGEMENT LEVEL FOR EACH USER ⎯ S320

PROVIDE CONSUMER GUIDE SERVICE ⎯ S330

| RETRIEVED INFORMATION | CONTENTS |
|---|---|
| COMPREHENSIVE INFORMATION OF ALL MANAGED VEHICLES | -NUMBER OF VEHICLES DEPENDING ON WHETHER VEHICLE IS DRIVEN (FOR EXAMPLE, IN A STATE OF BEING DRIVEN OR IN A STATE OF NOT BEING DRIVEN), AND FOR EACH STATE REQUIRING INSPECTION<br>-NUMBER OF VEHICLES FOR EACH OF STATES SUCH AS RAPID DECELERATION, RAPID ACCELERATION, HIGH-TEMPERATURE ENVIRONMENT, LOW-TEMPERATURE ENVIRONMENT, RAPID CHARGING, RAPID DISCHARGING, AND ACCIDENT<br>-LIST OF VEHICLES IN WHICH ABNORMAL BEHAVIOR IS DETECTED<br>-NUMBER OF VEHICLES FOR EACH BATTERY STATE (SOH) AND NUMBER OF VEHICLES FOR EACH SOC SECTION |
| BATTERY INFORMATION FOR EACH VEHICLE | -MANUFACTURER, A MODEL, A VEHICLE NUMBER, A MODEL YEAR, A MILEAGE<br>-BATTERY STATE (SOH), SOC (%), AND DRIVABLE DISTANCE<br>-HISTORY OF ABNORMAL BEHAVIORS IN PAST AND HISTORY OF ABNORMAL BEHAVIORS SUCH AS CURRENT BATTERY TEMPERATURE AND EXTERNAL TEMPERATURE<br>-MONTHLY BATTERY MANAGEMENT SCORE, MONTHLY BATTERY MANAGEMENT SCORE TREND, COMPARISON BETWEEN BATTERY MANAGEMENT SCORE OF USER AND BATTERY MANAGEMENT SCORES OF OTHER USERS (FOR EXAMPLE, TOP 90%)<br>-SCORE FOR EACH CHARGING HABIT, DRIVING HABIT, PARKING AND STOPPING HABIT, AND TOTAL BATTERY MANAGEMENT SCORE<br>-BATTERY LEDGER INFORMATION INCLUDING BATTERY MANUFACTURER, NUMBER, RELEASE DATE, CAPACITY, MILEAGE, NUMBER OF TIMES OF CHARGING, NUMBER OF TIMES OF RAPID/SLOW CHARGING, MAINTENANCE HISTORY, REPLACEMENT HISTORY, AND NOTIFICATION RECEPTION HISTORY<br>-COMPARISON BETWEEN REMAINING LIFESPAN OF A USER AND REMAINING LIFESPANS OF OTHER USERS |
| ALARM INFORMATION | -FIRE, SUDDEN DISCHARGE, COMPLETE DISCHARGE, AND SUDDEN DEATH<br>-BATTERY CHARGE STATE, CHARGING COMPLETION ALARM, AND CHARGING STATION RECOMMENDATION<br>-HIGH-FREQUENCY DISCHARGE, HIGH-TEMPERATURE/LOW-TEMPERATURE PARKING, AND RAPID ACCELERATION<br>- NUMBER OF TIMES VEHICLE IS COMPLETELY DISCHARGED, NUMBER OF TIMES BATTERY IS CHARGED IN SITUATION IN WHICH BATTERY IS AT HIGH TEMPERATURE, NUMBER OF TIMES OF RAPID ACCELERATIONS WHILE VEHICLE IS BEING DRIVEN |

FIG. 7

SYSTEM AND METHOD OF MONITORING BATTERY

CROSS-REFERENCE TO RELATED APPLICATION(S)

This application claims benefit of priority to Korean Patent Application No. 10-2021-0090208 filed on Jul. 9, 2021 in the Korean Intellectual Property Office, the disclosure of which is incorporated herein by reference in its entirety.

TECHNICAL FIELD

The present disclosure relates to a battery monitoring system.

BACKGROUND

As the demand for hybrid vehicles or electric vehicles (hereinafter simply referred to as "vehicles") has increased, the demand for batteries has also increased. Business operators in various fields related to vehicles have economic interests depending on how a vehicle user utilizes a battery of the vehicle, and the vehicle user also needs to appropriately operate the battery to promote convenience in vehicle driving. Therefore, it is desirable to appropriately manage operations of a battery for a vehicle that is currently being actively distributed.

SUMMARY

Various implementations of a battery management service currently provided to vehicle users and business operators may not provide unprofessional or consumer-friendly battery information indicators due to the use of highly technical terms or jargons that may not be easily understood by many users. In addition, there is a lack of monitoring, quantitative judgment, and guide systems for comprehensive user battery management behaviors such as charging, driving, parking, and the like.

An aspect of the present disclosure is to provide a battery monitoring system capable of implementing a battery monitoring service providing a battery management guide based on battery lifespan prediction, abnormal battery behavior detection, and a battery management score.

According to an aspect of the present disclosure, a battery monitoring system includes a data receiver configured to receive battery information data and vehicle information data from a data collecting device connected to a vehicle, a battery management score calculator configured to calculate, based on the battery information data and the vehicle information data, factors affecting battery degradation among a charging habit, a driving habit, and a parking habit of a user, calculate, based on the factors, a battery management score, and store the battery management score in a database, and an information transmitter configured to transmit the battery management score to a terminal.

According to another aspect of the present disclosure, a method of monitoring a battery includes receiving battery information data and vehicle information data from a data collecting device connected to a vehicle, calculating, based on the battery information data and the vehicle information data, factors affecting battery degradation among a charging habit, a driving habit, and a parking habit of a user, and calculating, based on the factors, a battery management score, predicting a remaining lifespan of the battery from the battery information data using an artificial intelligence (AI)-based prediction algorithm, and transmitting, to a terminal, the battery management score and the remaining lifespan of the battery.

According to example embodiments of the present disclosure, a battery management score may be calculated by comprehensively calculating factors affecting battery degradation among a charging habit, a driving habit, and a parking habit of a user, thereby effectively managing a battery through a consumer-friendly and quantified battery indicator. In addition, extension of a battery lifespan may be induced by providing a battery management guide to the user, and secondary use value and eco-friendly added value of a battery may be maximized by extending the battery lifespan. In addition, various business operators who have interests due to battery operation may benefit from economic and eco-friendly added value due to the extension of the battery lifespan.

The various and beneficial advantages and effects of the present disclosure are not limited to the above, and will be more easily understood in the course of describing specific example embodiments.

BRIEF DESCRIPTION OF DRAWINGS

The above and other aspects, features, and advantages of the present disclosure will be more clearly understood from the following detailed description, taken in conjunction with the accompanying drawings, in which:

FIG. 4 is a diagram illustrating factors affecting battery degradation according to an example embodiment of the present disclosure;

FIG. 7 is a diagram illustrating pieces of information provided by a battery monitoring system according to an example embodiment of the present disclosure.

DETAILED DESCRIPTION

Details of certain features in the example embodiments are included in the detailed description and drawings.

The aspects and features of the present disclosure and methods of achieving the aspects and features will be apparent by referring to the example embodiments to be described in detail with reference to the accompanying drawings. However, the present disclosure is not limited to the example embodiments disclosed hereinafter, and may be implemented in various different forms.

Figure 1:
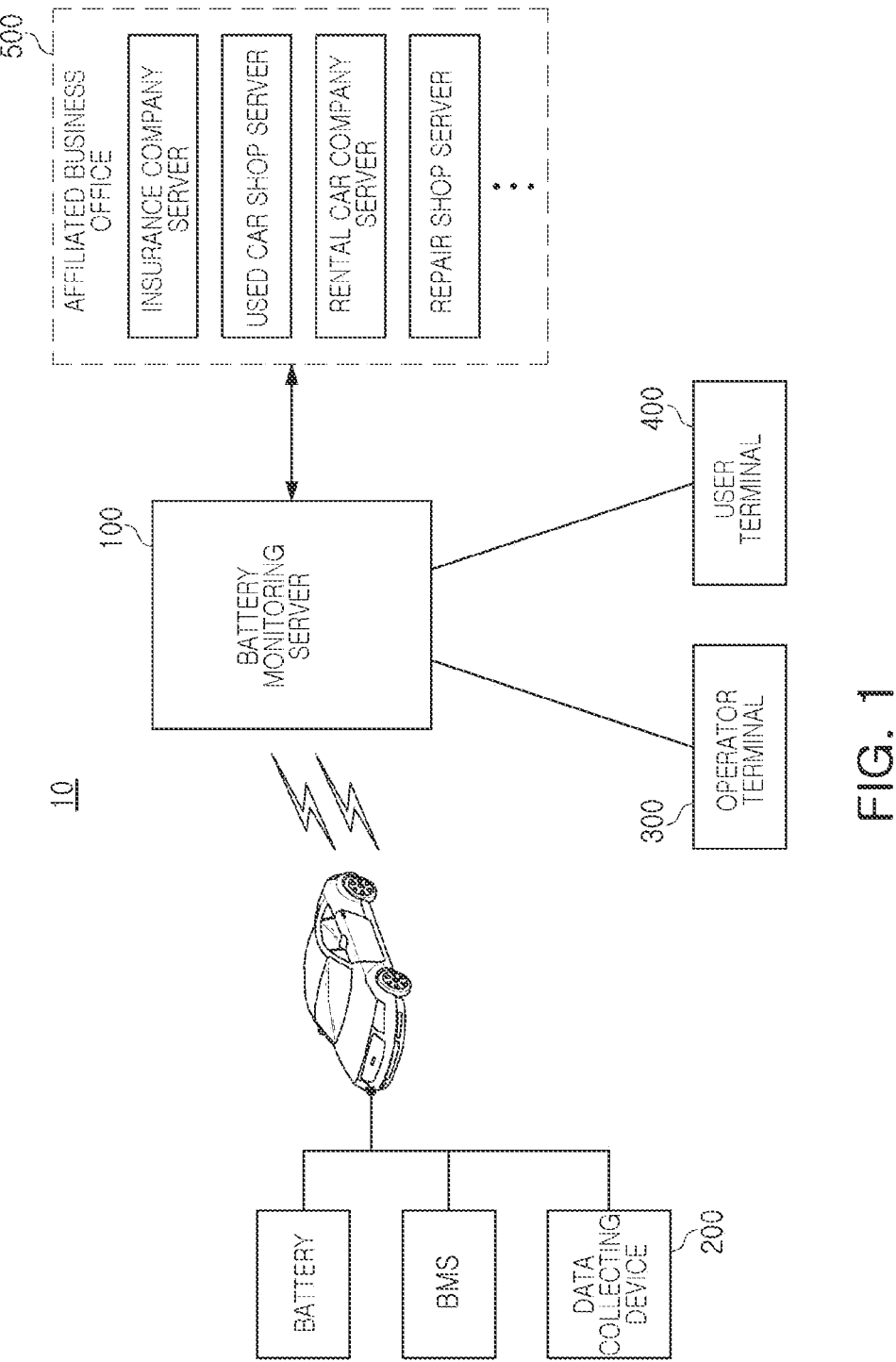
FIG. 1 is a block diagram illustrating a system for providing a battery monitoring service according to an example embodiment of the present disclosure.

FIG. 1 is a block diagram illustrating a system for providing a battery monitoring service according to an example embodiment of the present disclosure.

Referring to FIG. 1, a battery monitoring system 10 may refer to a system for extending a battery lifespan, preventing an accident, and providing convenience by providing a battery usage and management guide to a user, based on management indicators related to factors affecting battery degradation. The management indicators may include battery lifespan prediction, abnormal battery behavior prediction, and a battery management score, and each management indicator may refer to a battery state and a battery management habit of the user being quantified in a format that is easy for the user to understand.

The battery monitoring system 10 may include a battery monitoring server 100, a data collecting device 200, an operator terminal 300, a user terminal 400, and an affiliated business office server 500. A vehicle may include a battery charging and holding electric energy, driving energy of the vehicle, and a battery management system (BMS) managing the battery, and the BMS may monitor a state of the battery to serve to automatically manage the battery such that the battery is maintained and used under an optimal condition. The data collecting device 200 may be connected to the BMS and the like of the vehicle to receive various pieces of state information of the battery and output the various pieces of state information to the outside. The data collecting device 200 may be an on-board diagnostic (OBD) device or an on-board diagnostic version II (OBD-II) device connected to an electric vehicle.

The data collecting device 200 may transmit, to the battery monitoring server 100, vehicle information data and battery information data in real time via short-range communication (Wi-Fi and Bluetooth) or a mobile communication network (LTE).

An operator, a person who manages and operates multiple vehicles, may be a fleet management business operator, a rental car business operator, a corporate vehicle business manager, an insurance company, and the like. The operator terminal 300 may be a personal computer (PC) of the operator.

A user may be a personal vehicle owner or driver. The user terminal 400 may include a mobile phone, a smart phone, a laptop computer, a tablet PC, a wearable device, and the like of the user.

Depending on a type of operator and user, a search result may target all managed vehicles, or may be limited to a driven vehicle or an owned vehicle.

The affiliated business office server 500 may include a repair shop server diagnosing a vehicle or a battery, and repairing or replacing the vehicle or the battery. In addition, the affiliated business office server 500 may include various business office servers that have interests due to battery operation, and may include, for example, an insurance company server, a used car shop server, a rental car company server, and the like.

According to an example embodiment of the present disclosure, the battery monitoring server 100 may receive the battery information data and the vehicle information data from the data collecting device 200, and predict a lifespan of the battery using the battery information data and the vehicle information data, detect abnormal battery behavior, and calculate a battery management score. The battery information data and the vehicle information data may include a voltage, a current, a temperature, a state of charge (SOC), a state of health (SOH), charge information, a charge/discharge history, driving information, a battery temperature, an external temperature, and the like of the battery.

The battery management score may be calculated by comprehensively calculating factors affecting battery degradation among a charging habit, a driving habit, and a parking habit of the user, thereby effectively managing the battery through a consumer-friendly and quantified battery indicator. In addition, extension of the lifespan of the battery may be induced by providing a battery management guide to the user, and secondary use value and eco-friendly added value of the battery may be maximized by extending the battery lifespan.

Figure 2:
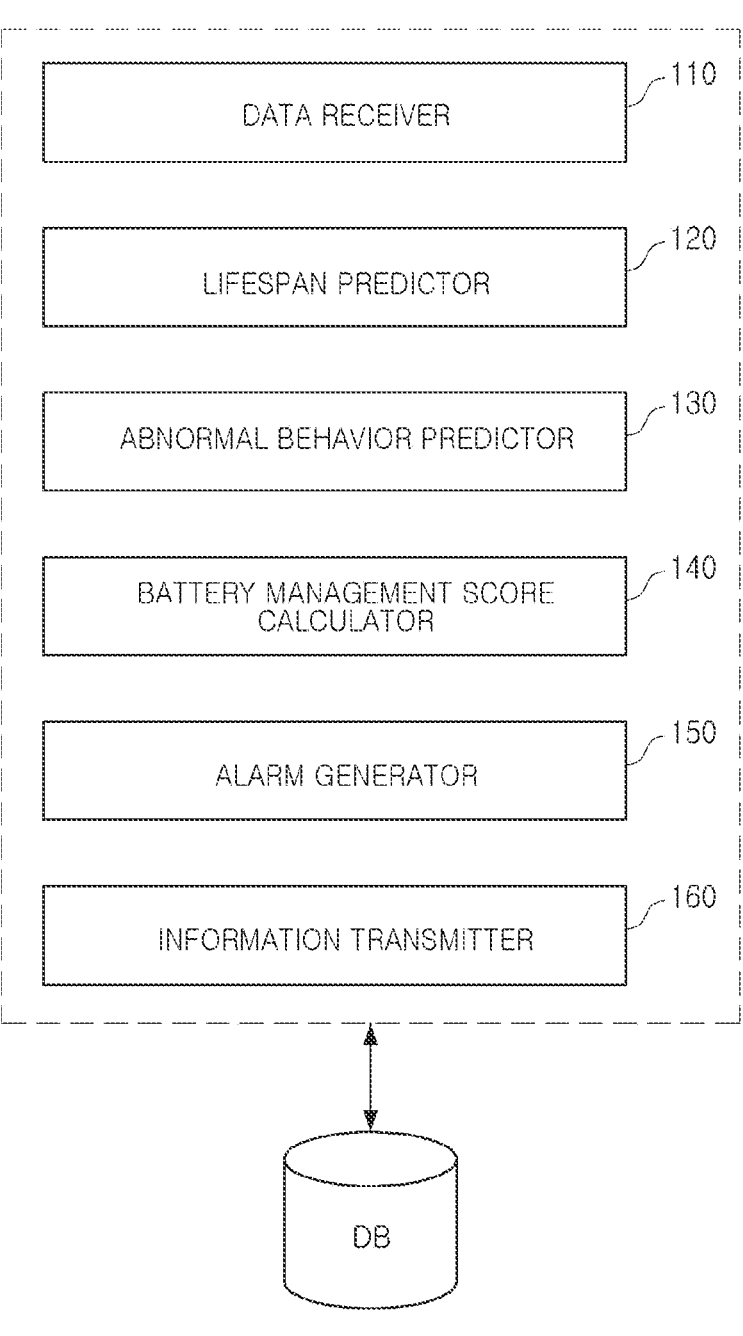
FIG. 2 is a block diagram illustrating a battery monitoring server according to an example embodiment of the present disclosure.

FIG. 2 is a block diagram illustrating a battery monitoring server according to an example embodiment of the present disclosure.

Referring to FIG. 2, the battery monitoring server 100 may include a data receiver 110, a lifespan predictor 120, an abnormal behavior predictor 130, a battery management score calculator 140, an alarm generator 150, and an information transmitter 160. The lifespan predictor 120 predicting a lifespan of a battery and the abnormal behavior predictor 130 predicting abnormal battery behavior may quantify a state of the battery in a format that is easy for a user to understand, and the battery management score calculator 140 may quantify a battery management habit of the user in a format that is easy for the user to understand.

Figure 3:
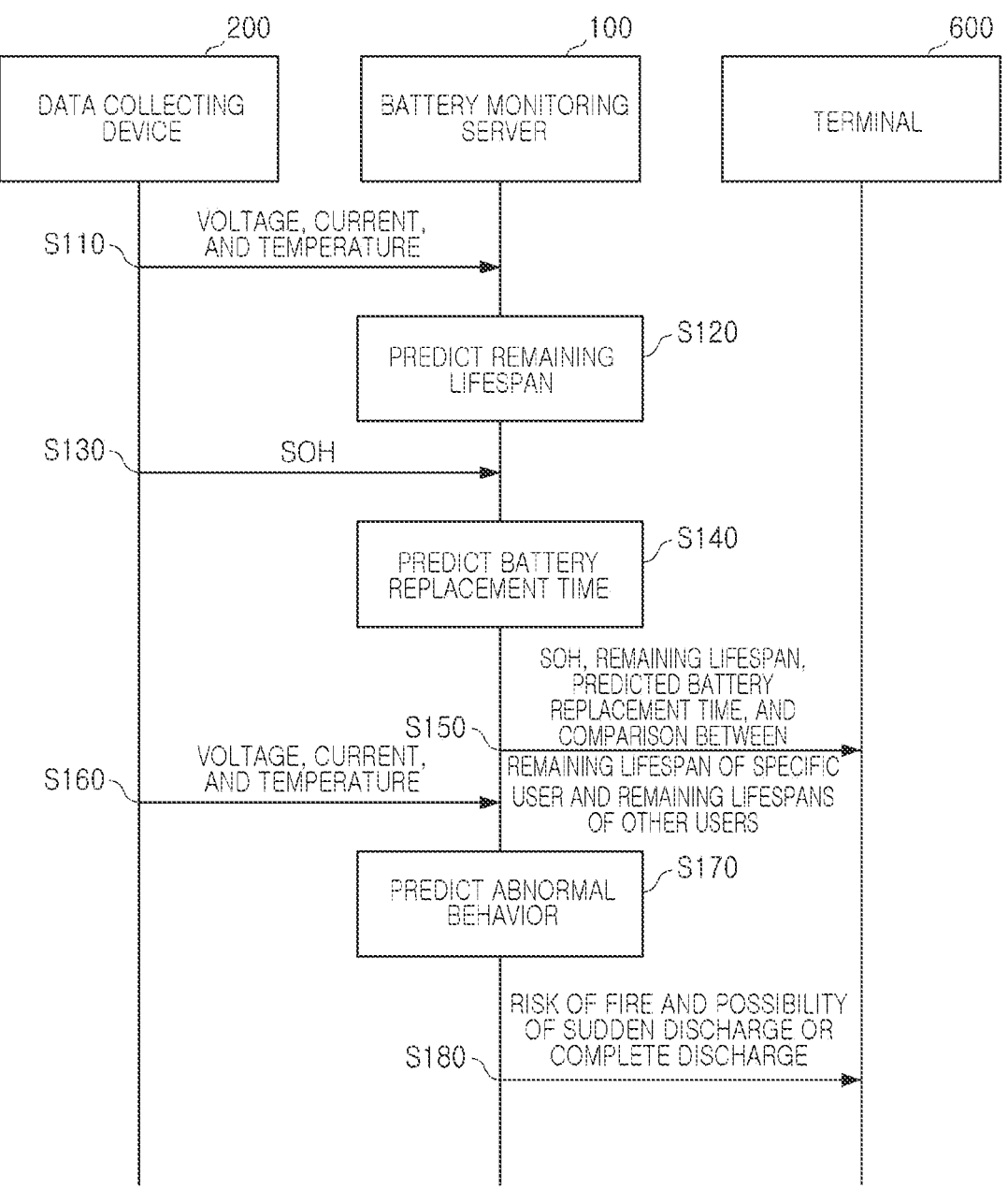
FIG. 3 is a data flowchart illustrating a method of operating a battery monitoring system according to an example embodiment of the present disclosure.

FIG. 3 is a data flowchart illustrating a method of operating a battery monitoring system according to an example embodiment of the present disclosure.

Lifespan Predictor

Referring to FIGS. 2 and 3 together, the data receiver 110 may receive voltage, current, and temperature data of a battery through the data collecting device 200 (S110). The lifespan predictor 120 may predict a remaining lifespan of the battery from the voltage, current, and temperature data of the battery using an artificial intelligence (AI)-based SOH prediction algorithm (S120). The remaining lifespan of the battery may be stored in a database DB.

When an SOH of the battery falls below a predetermined level (for example, 80%), it may mean that the battery is no longer usable as a battery of a vehicle. The remaining lifespan may refer to a value obtained by predicting a battery lifespan, which is a period of time required for the SOH to reach the predetermined level. When additional battery degradation factors such as a battery management score factor to be described below and the like are identified, the additional degradation factors for lifespan prediction may be reflected.

In addition, the remaining lifespan of the battery may vary depending on a user driving habit for each user under the same driving conditions (a vehicle model, a driving distance, and the like). Accordingly, the lifespan predictor 120 may compare and analyze a remaining lifespan of a battery of a specific user and remaining lifespans of batteries of other users. A result of comparing the remaining lifespan of the specific user with the remaining lifespans of the other users may be stored in the database DB.

The data receiver 110 may receive an SOH generated by a BMS through the data collecting device 200 (S130). The SOH may refer to a current health state (%) of the battery. The SOH may be stored in the database DB.

The lifespan predictor 120 may predict, based on the SOH, a battery replacement time (S140). The predicted battery replacement time may be stored in the database DB.

The information transmitter 160 may inform an operator terminal and/or a user terminal (hereinafter, collectively referred to as a terminal; 600) of the SOH, remaining lifespan, predicted battery replacement time, and comparison between the remaining lifespan of the battery of the specific user and the remaining lifespans of the batteries of the other users (S150).

In some example embodiments, the information transmitter 160 may inform and guide the user regarding charging, driving, and parking habits of a vehicle so as to extend the lifespan of the battery.

Abnormal Behavior Predictor

Abnormal battery behavior may refer to a voltage imbalance between battery cells, a change in temperature during battery charging, and the like. The data receiver 110 may receive the voltage, current, and temperature data of a battery through the data collecting device 200 (S160). The abnormal behavior predictor 130 may detect the abnormal battery behavior from the voltage, current, and temperature data of the battery using an AI-based prediction algorithm (S170). The abnormal battery behavior may be stored in the database DB.

In addition, additional degradation factors for predicting abnormal battery behavior, such as a physical position of a battery cell in a battery pack, may be reflected. For example, a temperature of the battery may vary depending on whether the battery cell is close to a coolant or an engine. Accordingly, different abnormal behaviors may appear depending on the position of the battery cell in the battery pack.

The information transmitter 160 may inform, based on the abnormal battery behavior, a terminal 600 of a risk of accidents such as fire, sudden discharge, or complete discharge (S180).

In some example embodiments, the information transmitter 160 may recommend a user to receive maintenance, and may automatically reserve an associated repair shop for the maintenance. In addition, the alarm generator 150 may transmit an alarm to charge a battery in advance, and may automatically reserve a field service for charging.

FIG. 4 is a diagram illustrating factors affecting battery degradation according to an example embodiment of the present disclosure.

Battery Management Score

A battery management score may refer to an SOH management state being scored based on a charging habit, a driving habit, and a parking habit of a driver, which are factors affecting battery degradation. The battery management score calculator 140 may calculate the battery management score as an indicator indicating a battery management level for each user or each battery. A battery monitoring server may calculate the factors affecting battery degradation among the charging habit, the driving habit, and the parking habit of the driver, and may calculate, based on the factors, the battery management score. The battery management score may be stored in the database DB.

Referring to FIG. 4, the charging habit of the driver may include the number of times of rapid charging, the number of times of slow charging, a ratio of the number of times of rapid charging to the number of times of slow charging, the number of times of charging from an SOC of 20% or less to an SOC of 100%, an unattended period of time after charging up to an SOC of 100%, the number of times a battery is charged in a situation in which the battery is at high temperature, the number of times the battery is charged in a situation in which a temperature difference between an external temperature and a battery temperature is a predetermined temperature (for example, 20° C.) or more, and the like.

The driving habit of the driver may include the number of rapid accelerations while a vehicle is being driven, the number of rapid decelerations while the vehicle is being driven, and a period of time required for driving in a high-temperature environment (for example, 45° C.).

The parking habit of the driver may include a period of time when the vehicle is left unattended in a direct-sunlight and high-temperature environment, the number of times the vehicle is completely discharged (for example, an SOC of 0%), and the like.

Referring to FIGS. 2 and 4 together, the battery management score calculator 140 may calculate the battery management score in a manner of deducting a point from a total score whenever one of the factors affecting battery degradation is applied. In another example embodiment, the battery management score calculator 140 may calculate a charging habit score, a driving habit score, a parking habit score of the driver, respectively, and may also calculate the battery management score as a sum or average of the charging habit score, the driving habit score, and the parking habit score. In addition, the battery management score calculator 140 may calculate an comprehensive battery management score by reflecting a remaining lifespan predicted through an AI-based prediction algorithm, an SOH of a BMS, and the like in the battery management score.

Figure 5:
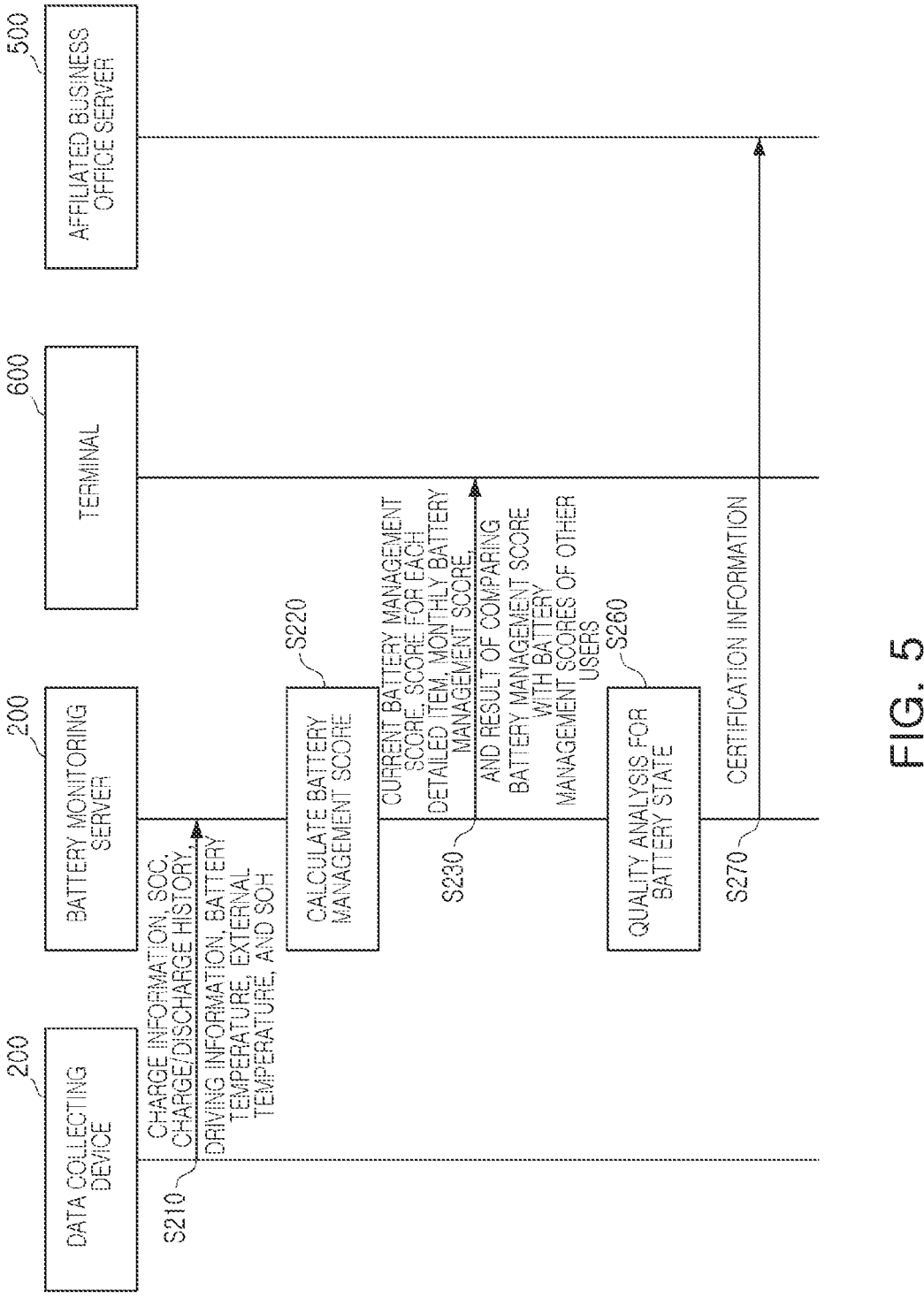
FIG. 5 is a data flowchart illustrating a method of operating a battery monitoring system according to an example embodiment of the present disclosure.

FIG. 5 is a data flowchart illustrating a method of operating a battery monitoring system according to an example embodiment of the present disclosure.

Referring to FIGS. 2 and 5 together, the data receiver 110 may receive, from the data collecting device charge information, an SOC, a charge/discharge history, driving information, a battery temperature, an external temperature, and an SOH (S210). The battery management score calculator 140 may calculate, based on the data received from the data receiver 110, a battery management score (S220). The battery management score may be stored in the database DB.

Charging Habit

Specifically, the data receiver 110 may receive charge information (for example, a charging current value from a BMS, and the like) from the data collecting device 200. The battery management score calculator 140 may calculate, based on the charge information, the number of times of rapid charging, the number of times of slow charging, a ratio of the number of times of rapid charging to the number of times of slow charging, and the like.

The data receiver 110 may receive, from the data collecting device 200, the SOC and the charge/discharge history. The battery may be charged and discharged at an SOC of 50% (or in a range of 20% to 80%). Accordingly, the battery management score calculator 140 may calculate the number of times of charging at an SOC of 20% or less, the number of times of charging up to an SOC of 100%, and the like.

The data receiver 110 may receive driving information from the data collecting device 200. The battery management score calculator 140 may calculate, based on the driving information, the SOC, and the charge/discharge history, an unattended period of time after 100% charging.

The data receiver 110 may receive a battery temperature from the data collecting device 200. For example, when the battery temperature is 35° C. or higher, rapid charging with an SOC of 80% or higher may affect battery degradation. Accordingly, the battery management score calculator 140 may calculate, based on the battery temperature and the charge/discharge history, the number of times the battery is charged in situation in which the battery is at high temperature.

The data receiver 110 may receive an external temperature from the data collecting device 200. The battery management score calculator 140 may calculate, based on the external temperature, the battery temperature, and the charge/discharge history, the number of times the battery is charged in a situation in which a temperature difference between the external temperature and the battery temperature is a predetermined temperature (for example, 20° C.) or more, and the like.

Driving Habit

The data receiver 110 may receive, from the data collecting device 200, a current of the BMS, an output of a micro controller unit (MCU), and the like. The battery management score calculator 140 may calculate, using the current of the BMS, the output of the MCU, and the like, the number of rapid accelerations while a vehicle is being driven and the number of rapid decelerations while the vehicle is being driven.

The battery management score calculator 140 may calculate, using the external temperature, the driving information, and the like, a period of time when the vehicle is driven in a high-temperature environment (for example, 45° C. or higher).

Parking Habit

The battery management score calculator 140 may calculate, using the external temperature, the driving information, and the like, a period of time when the vehicle is left unattended in a direct-sunlight and high-temperature environment (for example, 45° C. or higher).

The battery management score calculator 140 may calculate, using the SOC, the charge/discharge history, and the like, the number of times the vehicle is completely discharged (an SOC of 0%).

The battery management score calculator 140 may compare and analyze a battery management score of a specific user and battery management scores of other users stored in the database DB.

The information transmitter 160 may transmit, to the terminal 600, a current battery management score of an individual, a score for each detailed item, a monthly battery management score of the individual, and a result of comparing the battery management score of the individual with battery management scores of other users (S230).

In some example embodiments, a guide for improved charging, driving, and parking directions may be provided to a user with a low battery management score. For example, a guide may be provided to lower a rapid charging rate from 80% to 60%, or to reduce the number of rapid accelerations.

In addition, a differential incentive for each battery management score may be provided to a user with a high battery management score, and a differential decentive for each battery management score may be provided to a user with a low battery management score.

For example, the high battery management score may refer to a high battery residual value, and thus a used car price may be set high when selling a used car. Accordingly, the user with the high battery management score may be provided with quality certification or quality assurance for a battery usage history and a battery state when a used car transaction is performed. Accordingly, the battery management score calculator 140 may generate, based on the battery management score, certification information for certifying or assuring quality of a battery state (S260), and the information transmitter 160 may transmit the certification information on the battery state to the affiliated business office server 500 (S270). In some example embodiments, the user with the high battery management score may receive, based on the battery management score, a discount on insurance premiums.

Figure 6:
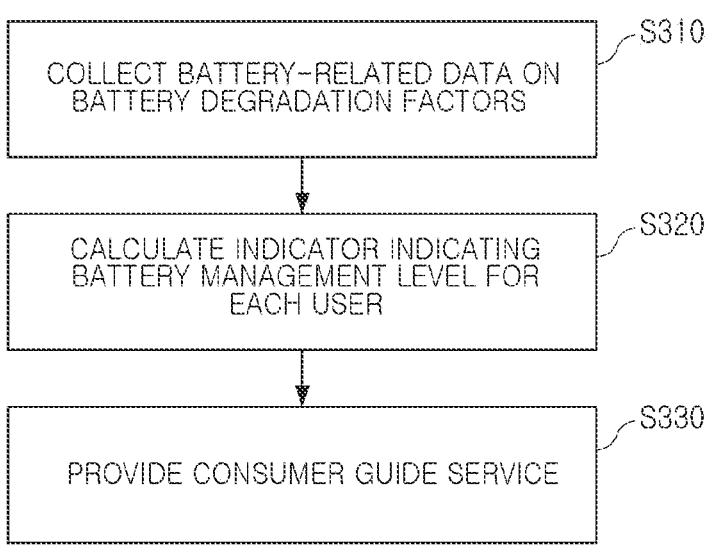
FIG. 6 is a flowchart illustrating an overall operation of a battery monitoring system according to an example embodiment of the present disclosure.

FIG. 6 is a flowchart illustrating an overall operation of a battery monitoring system according to an example embodiment of the present disclosure.

Referring to FIG. 6, the battery monitoring service system may collect battery information data to determine factors affecting battery degradation (S310). For example, the factors affecting battery degradation may include factors determined by the use and management of a battery in addition to factors determined by the production of the battery, such as a physical position of a battery cell in a battery pack, and the like.

The battery monitoring service system may calculate, based on the factors determined by the use and management of the battery among the factors affecting battery degradation, an indicator indicating a battery management level for each user (S320). The indicator indicating the battery management level may include a battery management score, battery remaining lifespan prediction, abnormal battery behavior prediction, and the like.

The battery monitoring service system may provide, based on the indicator indicating the battery management level, information, an alarm, and a guide service to a user (S330). For example, the battery monitoring service system may inform the user of a predicted remaining lifespan, or may inform the user of a risk of fire and a possibility of sudden discharge or complete discharge when abnormal battery behavior is detected. In addition, the battery monitoring service system may recommend the user to receive maintenance and automatically reserve an associated repair shop for maintenance, transmit an alarm to charge the battery in advance, or automatically reserve a field service for charging.

In addition, the battery monitoring service system may provide a differential incentive for each battery management score to a user with a high battery management score, and provide a differential decentive for each battery management score to a user with a low battery management score. For example, the user with the high battery management score may be provided with quality certification or quality assurance for a battery usage history and a battery state when a used car transaction is performed, thereby providing, to the user, extension of a battery lifespan, prevention of an accident, and convenience.

FIG. 7 is a diagram illustrating pieces of information provided by a battery monitoring system according to an example embodiment of the present disclosure.

Referring to FIG. 7, comprehensive information of all managed vehicles may be retrieved in the battery monitoring system. For example, the battery monitoring system may provide the number of vehicles depending on whether a vehicle is driven (for example, in a state of being driven or in a state of not being driven), and for each state requiring inspection. In addition, the battery monitoring system may provide the number of vehicles for each of states such as rapid deceleration, rapid acceleration, high-temperature environment, low-temperature environment, rapid charging, rapid discharging, an accident, and the like. In addition, the battery monitoring system may provide a list of vehicles in which an abnormal behavior is detected. In addition, the battery monitoring system may provide the number of vehicles for each battery state (SOH) and the number of vehicles for each SOC section.

Battery information for each vehicle may be retrieved in the battery monitoring system. For example, the battery monitoring system may provide vehicle information such as a manufacturer, model, vehicle number, model year, mileage, and the like. In addition, the battery monitoring system may provide a battery state (SOH) as bad, normal, and good or as a percentage (%), and may provide an SOC (%) and a drivable distance. In addition, the battery monitoring system may provide a history of abnormal behaviors in the past and a history of abnormal behaviors such as a current battery temperature, external temperature, and the like. In addition, the battery monitoring system may provide a monthly battery management score, a monthly battery management score trend, a comparison between a battery management score of a user and battery management scores of other users (for example, top 90%), and the like. In addition, the battery monitoring system may provide a score for each charging habit, driving habit, parking and stopping habit, and a battery management score. In addition, the battery monitoring system may provide battery ledger information including a battery manufacturer, a number, a release date, a capacity, a mileage, the number of times of charging, the number of times of rapid/slow charging, a maintenance history, a replacement history, a notification reception history, and the like. A battery ledger may refer to a collection of battery properties and usage history information. In addition, the battery monitoring system may provide a comparison between a remaining lifespan of a battery of a user and remaining lifespans of other users.

Specifically, the battery ledger information may refer to battery information collected over an entire lifespan cycle of a battery for each battery ID assigned per battery unit. The entire lifespan cycle of the battery may refer to a cycle from when the battery is first produced (sold) to when the battery is used, reused, and recycled (discarded). A battery unit may refer to a battery pack, a battery module, or a battery cell, and the battery ledger information may include production information, state information, and usage information of the battery. An information transmitter of a battery monitoring server may transmit, to a terminal, the battery ledger information including the production information generated when a battery is produced, the state information that is information on a current usage state of the battery, and the usage information that is information on a usage history of the battery. The battery ledger information may be stored in advance in a database.

Alarm information may be retrieved in the battery monitoring system. For example, the battery monitoring system may predict an abnormal behavior, and provide, based on a result of the prediction, a possibility of fire, sudden discharge, complete discharge, sudden death, or the like. In addition, the battery monitoring system may provide a battery charge state, a charging completion alarm, and a charging station recommendation. In addition, the battery monitoring system may provide attention to issues such as high-frequency discharge, high-temperature/low-temperature parking, rapid acceleration, and the like. In addition, the battery monitoring system may provide the number of times a vehicle is completely discharged, the number of times a battery is charged in a situation in which the battery is at high temperature, the number of rapid accelerations while the vehicle is being driven, and the like. An alarm history may be sorted by date in ascending or descending order. In case of an alarm within the last 7 days, a "NEW" badge may also be exposed.

According to an example embodiment of the present disclosure, a rental car company may expect an increase in sales revenue of used vehicles by preserving a residual battery value, and may provide, to a consumer, a benefit corresponding to the increase in revenue. An insurance company may reduce an accident rate by preventing a battery accident and provide psychological stability to the consumer. In addition, it is possible to improve, based on battery management of a driver and abnormality detection, a loss ratio of the insurance company, and to provide a benefit such as reduction of insurance premiums to the consumer. A used car shop may provide more accurate and transparent used vehicles by managing a usage history for each battery, and achieve service differentiation such as battery diagnosis, residual value setting, quality certification, and the like.

In addition, the battery monitoring system of the present disclosure may be used for various electric mobility devices such as an energy storage system (ESS), an uninterruptible power supply (UPS), and the like as well as a vehicle.

While example embodiments have been shown and described above, variations and enhancements of the disclosed example embodiments and other embodiments may be made based on what is disclosed in this patent document.

What is claimed is:

1. A battery monitoring system comprising:
a data receiver in communication with a data collecting device electrically or communicatively connected to a vehicle and configured to receive battery information data and vehicle information data from the data collecting device, wherein the battery information data includes a combination of voltage, current, temperature data of the battery;
a battery management score calculator coupled to receive the battery information data and the vehicle information data and configured to: calculate, based on the battery information data and the vehicle information data, factors affecting battery degradation among a battery charging habit, a driving habit, and a parking habit of a user; calculate, based on the factors, a battery management score; and store the battery management score in a database; and control charging parameters or acceleration parameters of the vehicle to reduce a charging limit threshold or occurrence of rapid acceleration, based on the battery management score; and
an information transmitter in communication with a terminal and configured to transmit the battery management score to the terminal,
wherein the battery monitoring system further includes a lifespan predictor,
wherein the lifespan predictor is configured to predict a remaining lifespan of the battery based on the combination of the voltage, current, and temperature data, using an artificial intelligence (AI)-based prediction algorithm, and store the remaining lifespan of the battery in the database, and
wherein the information transmitter is configured to transmit the remaining lifespan of the battery to the terminal.

2. The battery monitoring system of claim 1, wherein:
the battery management score calculator is configured to compare a battery management score of a specific user with battery management scores of other users stored in the database; and
the information transmitter is configured to transmit, to the terminal, a result of comparing the battery management score of the specific user with the battery management scores of the other users stored in the database.

3. The battery monitoring system of claim 1, wherein the battery management score calculator is configured to calculate a comprehensive battery management score by reflecting the remaining lifespan in the battery management score.

4. The battery monitoring system of claim 1, wherein:
the data receiver is configured to receive information on a state of health (SOH) of the battery from the data collecting device;
the lifespan predictor is configured to calculate, based on the received SOH information, a predicted replacement time of the battery, and store the predicted replacement time of the battery in the database; and the information transmitter is configured to transmit, to the terminal, the predicted replacement time of the battery.

5. The battery monitoring system of claim 1, wherein:

the lifespan predictor is configured to compare a remaining lifespan of a battery of a specific user with remaining lifespans of batteries of other users stored in the database; and the information transmitter is configured to transmit, to the terminal, a result of comparing the remaining lifespan of the battery of the specific user with the remaining lifespans of the batteries of the other users stored in the database.

6. The battery monitoring system of claim 1, further comprising:

an abnormal behavior predictor, wherein the data receiver is configured to receive, from the data collecting device, the combination of the voltage, current, temperature data of the battery, the abnormal behavior predictor is configured to detect an abnormal battery behavior based on the combination of the voltage, current, temperature data, using the AI-based prediction algorithm, and store the abnormal battery behavior in the database, and the information transmitter is configured to transmit, based on the abnormal battery behavior, a risk of an accident to the terminal.

7. The battery monitoring system of claim 6, wherein the abnormal battery behavior includes a voltage imbalance between different battery cells with the battery.

8. The battery monitoring system of claim 6, wherein the abnormal battery behavior includes a change in temperature inside the battery during battery charging.

9. The battery monitoring system of claim 1, wherein:

the battery management score calculator is configured to generate, based on the battery management score, insurance premium information to be used to calculate an automobile insurance premium for a user; and the information transmitter is configured to transmit the insurance premium information to an external computer server.

10. The battery monitoring system of claim 1, wherein:

the battery management score calculator is configured to generate, based on the battery management score, certification information for certifying or assuring quality of a battery state; and the information transmitter is configured to transmit the certification information on the battery state to an external computer server.

11. The battery monitoring system of claim 1, wherein:

the information transmitter is configured to transmit, to the terminal, battery ledger information stored in the database; and the battery ledger information includes production information generated when a battery is produced, state information that indicates a current usage state of the battery, and usage information that indicates a usage history of the battery.

12. A method of monitoring a battery of a vehicle, the method comprising:

receiving battery information data and vehicle information data from a data collecting device electrically or communicatively connected to the vehicle, wherein the battery information data includes a combination of voltage, current, and temperature data of the battery;

calculating, based on the battery information data and the vehicle information data, factors affecting battery degradation among a battery charging habit, a driving habit, and a parking habit of a user, and calculating, based on the factors, a battery management score;

controlling charging parameters or acceleration parameters of the vehicle to reduce a charging limit threshold or occurrence of rapid acceleration, based on the battery management score;

predicting a remaining lifespan of the battery based on the combination of the voltage, current, temperature data of the battery using an artificial intelligence (AI)-based prediction algorithm; and transmitting, to a terminal, the battery management score and the remaining lifespan of the battery.

13. The method of claim 12, further comprising:

calculating a comprehensive battery management score by reflecting the remaining lifespan in the battery management score.

14. The method of claim 12, further comprising:

detecting an abnormal battery behavior from the battery information data using the AI-based prediction algorithm.

15. The method of claim 14, wherein the abnormal battery behavior includes a voltage imbalance between different battery cells with the battery.

16. The method of claim 14, wherein the abnormal battery behavior includes a change in temperature inside the battery during battery charging.

* * * * *